United States Patent [19]

Wakui et al.

[11] Patent Number: 4,516,149

[45] Date of Patent: May 7, 1985

[54] SEMICONDUCTOR DEVICE HAVING RIBBON ELECTRODE STRUCTURE AND METHOD FOR FABRICATING THE SAME

[75] Inventors: Yoko Wakui, Ibaraki; Hiroaki Hachino, Hitachi; Mamoru Sawahata, Hitachi; Tasao Soga, Hitachi; Tomio Yasuda, Hitachi; Michio Ooue, Hitachi, all of Japan

[73] Assignee: Hitachi, Ltd., Tokyo, Japan

[21] Appl. No.: 315,905

[22] Filed: Oct. 28, 1981

[30] Foreign Application Priority Data

Nov. 4, 1980 [JP] Japan ................................. 55-153917

[51] Int. Cl.³ ..................... H01L 29/74; H01L 23/48; H01L 29/44; H01L 29/52
[52] U.S. Cl. ........................................ 357/71; 357/38; 357/68; 357/69; 357/70
[58] Field of Search ............... 357/69, 71, 38 E, 38 G, 357/38 C, 38, 70, 68

[56] References Cited

U.S. PATENT DOCUMENTS

| | | | |
|---|---|---|---|
| 3,633,076 | 1/1972 | Arndt | 357/71 |
| 3,781,596 | 12/1973 | Galli et al. | 357/71 |
| 3,822,467 | 7/1974 | Symersky | 357/71 |
| 3,900,771 | 8/1975 | Krausse | 357/38 |
| 3,943,546 | 3/1976 | Kaiser | 357/68 |
| 4,005,456 | 1/1977 | Botzenhart | 357/71 |
| 4,028,722 | 6/1977 | Helda | 357/69 |
| 4,097,890 | 6/1978 | Morris et al. | 357/71 |
| 4,223,328 | 9/1980 | Terasawa et al. | 357/38 |
| 4,240,595 | 1/1981 | Noyori et al. | 357/69 |
| 4,380,042 | 4/1983 | Angelucci et al. | 357/70 |

FOREIGN PATENT DOCUMENTS

55-115363  9/1980  Japan ................................. 357/38 E

*Primary Examiner*—Martin H. Edlow
*Assistant Examiner*—Jerome Jackson
*Attorney, Agent, or Firm*—Antonelli, Terry & Wands

[57] ABSTRACT

A semiconductor device is disclosed which is provided with at least one flexible conducting film having an inner electrode portion and an outer electrode portion. The inner electrode portion is conductively bonded to at least one of two kinds of electrode films formed on one main surface of a semiconductor substrate, and has a form similar to the shape of the electrode film. The outer electrode portion is integrated with the inner electrode portion into one body but is not bonded to the electrode film. The conducting film can be previously bonded to a transparent insulating film, if desired, and is arranged in registry with the electrode film on the semiconductor substrate, while being supported by the insulating film. Accordingly, the inner electrode portion of the conducting film is bonded to the electrode film having a complicated pattern, readily and accurately. The inner electrode portion serves to reduce the electric resistance of the electrode film and to increase the current capacity of the electrode.

1 Claim, 19 Drawing Figures

SEMICONDUCTOR DEVICE HAVING RIBBON ELECTRODE STRUCTURE AND METHOD FOR FABRICATING THE SAME

The present invention relates to a semiconductor device, and more particularly to an electrode structure which is conductively bonded to a semiconductor substrate and extends outward therefrom. A method for fabricating the above electrode structure is also disclosed. The present invention is suitably applied to a discrete semiconductor device for controlling a large electric current such as a transistor or a thyristor.

In a semiconductor device such as a gate turn-off thyristor (hereinafter referred to as a "GTO" thyristor), a static induction thyristor or transistor, or a bipolar transistor, a semiconductor substrate has a pair of main surfaces. Typically a control electrode and one of a pair of main electrodes are formed in proximate relationship to each other on one of the main surfaces. The above-mentioned control electrode is a gate electrode for a thyristor and a base electrode for a bipolar transistor. Further, in many cases, the other main electrode is formed on the other main surface of the semiconductor substrate.

In such a semiconductor device a main current, which flows through the semiconductor substrate when a predetermined power source and a predetermined load are connected between the main electrodes, can be controlled by applying a predetermined control voltage or current between one main electrode and the control electrode. In order that the above-mentioned control function can be performed uniformly and reliably throughout the semiconductor device, it is required to make the distance between any part of one main electrode and the control electrode as small as possible and to make uniform the electric resistance between any part of one main electrode and the control electrode. More particularly, if the resistances from the main electrode and from the control electrode to respective portions in the active region in the semiconductor bulk differ from place to place, current density distribution is inevitably localized at low resistance portions and the turn-off characteristic becomes non-uniform. In a GTO thyristor, for example, there may occur current localization and failure of gate turn-off. Accordingly, it is required to optimize the arrangement of one main electrode and the control electrode on one major surface of the semiconductor substrate and to make a uniform electrical connection between the outside and each of the one main electrode and the control electrode. Needless to say, it is desired to satisfy general requirements for semiconductor devices such as easy construction, simple handling, and excellent electrical characteristics including the control function, in addition to the above-mentioned requirements.

When viewed from such standpoints, conventional semiconductor devices are unsatisfactory. A typical example of the conventional semiconductor devices is well known in which electrode films formed directly on a semiconductor substrate are connected through lead wires to external electrode members serving as terminals of the semiconductor device. In general, a lead wire connects two points. Accordingly, when a large current is controlled in the above-mentioned example, the problem of current localization is likely to occur i.e. a non-uniform distribution). Further, when a large number of parallel lead wires are employed to avoid the localization of current, the bonding of lead wires forms a neck in the manufacturing process. Furthermore, the bonding of lead wires requires an area reserved solely for bonding, and therefore the current capacity is apt to be sacrificed.

An alternative lead structure which eliminates the use of lead wires is proposed in U.S. Pat. No. 3,689,991 to Aird which utilizes a longitudinally extending tape-like carrier including a metallic layer secured to a flexible insulative layer. The metal layer includes spaced finger-like leads which extend beyond the flexible tape area and are directly bonded to the contact portions provided on a semiconductor pellet. This technique may be advantageous to simplify the device assembly. The current localization and/or the nonuniform turn-off action, however, cannot be fully solved by such approach.

On the other hand, another typical example is known in which an electrode film is connected to an external electrode member through a metal plate. An example of this type is disclosed in, for example, U.S. Pat. No. 3,601,667, issued to Desmond on Aug. 24, 1971. Such a connection structure can solve the drawback of the connection structure through lead wires, but requires much labor to place the metal plate in registry with the electrode film at a predetermined position and to bond the metal plate to the electrode film, which is inconvenient in industrial manufacture. Such inconvenience is remarkable when a semiconductor substrate is provided with an electrode film having a complicated form (for example, when a semiconductor substrate is provided with interdigitated electrodes or multi-emitter electrodes). Further, it is not easy to deform the metal plate after the metal plate has been bonded to the electrode film, and therefore the metal plate offers a difficult problem in manufacturing the semiconductor device.

An object of the present invention is to provide a semiconductor device which can solve the drawbacks of the above-mentioned conventional semiconductor devices.

Another object of the present invention is to provide a semiconductor device having a sufficiently low resistance electrode which is small in size, and can control a large current.

In order to attain the above objects, a semiconductor device according to an aspect of the present invention is provided with a flexible conductive film having an inner electrode portion and an outer electrode portion. The inner electrode portion is conductively bonded to at least one of two kinds of electrodes films formed on one main surface of a semiconductor substrate, and has approximately the same shape as that of the electrode film. The outer electrode portion is integrated with the inner electrode portion, but is not bonded to the electrode film.

Further, a manufacturing method according to the present invention comprises the steps of preparing a composite structure of a flexible insulating film and at least two conducting films having predetermined patterns which are bonded on the flexible insulating film at predetermined locations, and placing the conducting films of the composite film on an electrode portion of a previously-prepared semiconductor substrate to bond the conducting film to the electrode portion.

According to the present invention, the inner electrode portion of each conducting film which is bonded to the electrode film has substantially the same form as the electrode film, and therefore the electrode film can be considered effectively to be relatively thick. Accordingly, the resistance of the electrode film is decreased, and thus a large current can be controlled.

Further, the conducting film has the outer electrode portion which is continuous with the inner electrode portion. Accordingly, a semiconductor device according to the present invention does not require lead wires, which are used as separate parts in the conventional semiconductor device, and the bonding of lead wires. The resistance of the outer electrode portion can also be made small by increasing the cross sectional area of the outer electrode portion. Further, since the conducting films are flexible, the conducting films can be readily bent. Accordingly, it is easy to assemble the semiconductor device.

The present invention will be apparent from the following detailed description taken in conjunction with the accompanying drawings, in which.

Now, explanation will be made in detail on an embodiment of a GTO element of multi-emitter type according to the present invention, with reference to FIGS. 1 and 2A to 2C.

Referring to FIGS. 1 and 2A to 2C, a semiconductor substrate 1 provided with a pair of main surfaces 101 and 102 has a stacked structure of a p-type emitter layer 2, an n-type base layer 3, a p-type base layer 4 and an n-type emitter layer 5 laminated in the direction from the main surface 102 to the main surface 101 in the order described. The n-type emitter layer 5 is divided into a plurality of parallel, strip-shaped sections to form a multi-emitter structure. On portions of the main surface 101 where the strip-shaped emitter regions 5 are exposed, are formed cathode electrode film sections 7 each of which is smaller in size than the exposed portion of each strip-shaped emitter region 5 but has a form similar to that of the exposed portion. In other words, a cathode electrode film is divided into a plurality of parallel, strip-shaped cathode sections. The p-type base layer 4 is formed in such a manner that the base layer 4 surrounds the strip-shaped emitter regions 5 in the main surface 101. A plurality of strip-shaped gate electrode film sections 6 are arranged on a portion of the main surface 101 where the p-type base layer 4 is exposed, in such a manner that the gate electrode sections 6 are parallel to and alternate with the cathode electrode sections 7. An anode electrode film 8 is formed all over the main surface 102 of the semiconductor substrate 1.

Each of the electrode films 6, 7 and 8 is formed by vapor-depositing chromium, nickel and silver in the order described to a total thickness of about 10 μm, on the semiconductor substrate 1 at a predetermined position thereof.

Figure 1:
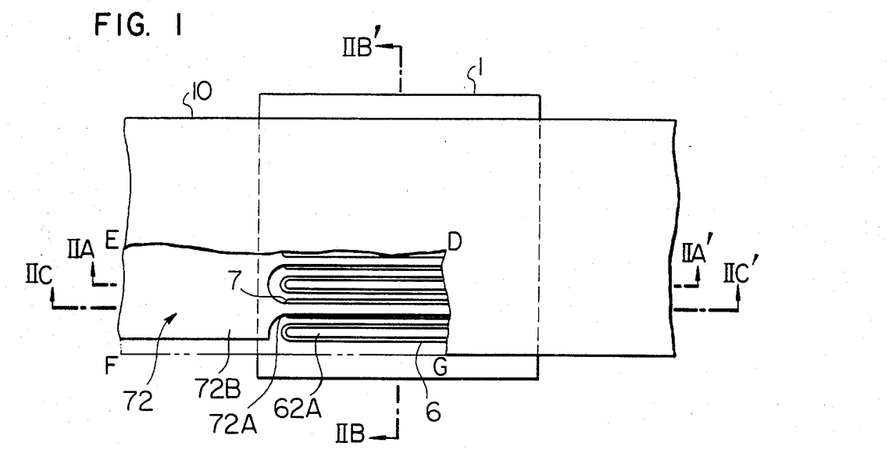
FIG. 1 is a partially cutaway plan view showing an embodiment of a GTO element according to the present invention.

Each of the strip-shaped emitter sections 5 has a width of about 220 μm and a length of about 6 mm in the main surface 101. A distance between adjacent strip-shaped emitter regions 5 is nearly equal to 220 μm, and the number of strip-shaped n-type emitter regions 5 is varied depending upon the current capacity of the GTO element.

A copper film (or foil) 62 for each gate electrode and a copper film 72 for each cathode electrode are bonded on the gate electrode film sections 6 and the cathode electrode film sections 7, respectively, with solder 20. More particularly, the copper films 62 and 72 are arranged in such a manner that, at their inner electrode portions 62A and 72A, the film 62 and the film 72 are spaced apart from each other by a predetermined distance to be isolated from each other. A length of the inner electrode portions 62A and 72A which face to one another is kept substantially constant. Each of the copper films 62 and 72 extends outward from the inner electrode portions 62A and 72A, and they are integrated with an extended portions joined to form an outer electrode portion or an external lead 62B and 72B for each of the films. The copper films 62 and 72 have a thickness of about 35 μm.

The copper films 62 and 72 are formed on an insulating, supporting film 11 which is made of transparent polyimide and which has a width slightly larger than the total width of the copper films 62 and 72. The insulating, supporting film 11 has a thickness of about 50 μm (see FIG. 1).

Incidentally, in order to facilitate the understanding of the above-mentioned composite structure, a part of the insulating, supporting film 11 (surrounded by reference characters D, E, F and G) is cut away in FIG. 1.

Figure 2A:
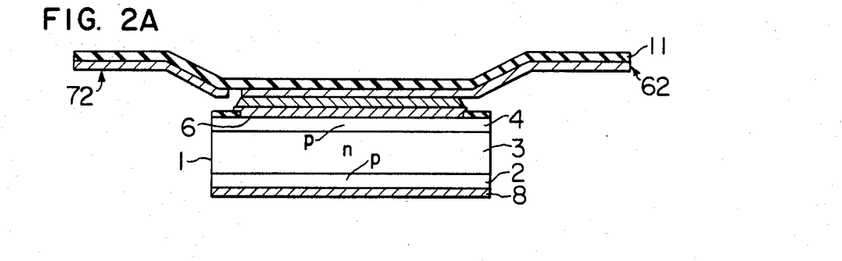
FIG. 2A is a sectional view taken along the line IIA—IIA' in FIG. 1.
Figure 2B:
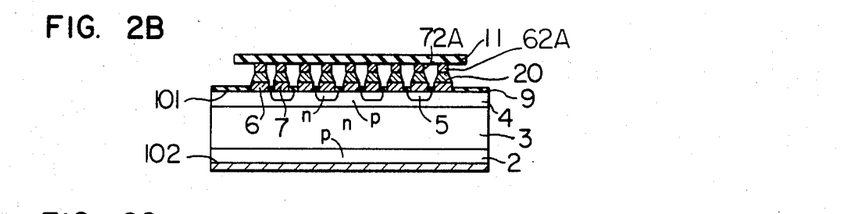
FIG. 2B is a sectional view taken along the line IIB—IIB' in FIG. 1.
Figure 2C:
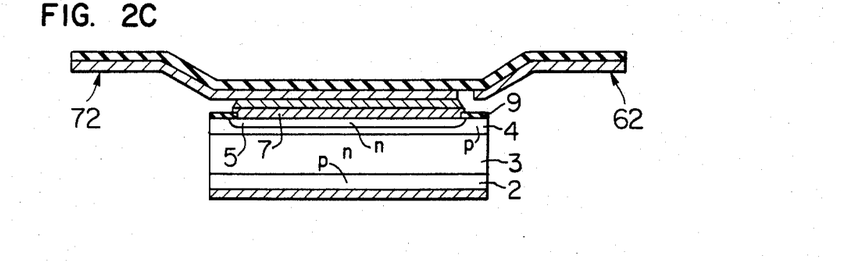
FIG. 2C is a sectional view taken along the line IIC—IIC' in FIG. 1.

FIGS. 2A, 2B and 2C show a cross section taken along the line IIA—IIA' in FIG. 1, a cross section taken along the line IIB—IIB' and a cross section taken along the line IIC—IIC', respectively. In more detail, FIG. 2A shows a cross section of a gate portion, FIG. 2C shows a cross section of a cathode portion, and FIG. 2B shows a cross section taken along a direction perpendicular to the longitudinal direction of the cathode and gate electrodes. The positional relation among the semiconductor substrate 1, copper film 62 for the gate electrode, copper film 72 for the cathode electrode and the insulating, supporting film 11, can be clarified by FIGS. 1 and 2A to 2C.

The above-mentioned embodiment of a GTO element according to the present embodiment is fabricated in the following manner.

A semiconductor substrate 1 made of silicon and having a four-layered structure of pnpn is prepared in accordance with a conventional method for fabricating a semiconductor four-layer device. An outer n-type layer (acting as the cathode emitter) is formed by selectively diffusing phosphorus into an adjacent p-type layer.

After an $SiO_2$ film 9 has been formed on the substrate at predetermined portions, chromium, nickel and silver are deposited in the order described to a total thickness of about 10 μm on a pair of main surfaces of the substrate 1 to form an anode electrode film 8, a gate electrode film 6 and a cathode electrode film 7. Then, the electrode films 6 and 7 are processed through the lift-off technique to have predetermined forms.

Figure 3:
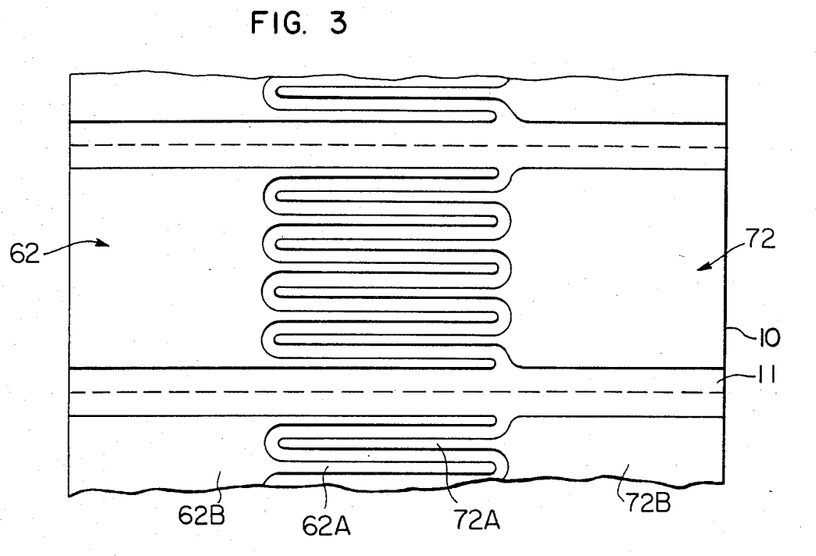
FIG. 3 is a plan view showing a composite structure of an insulating film and conductive films bonded thereon, used in the above-mentioned embodiment.

On the other hand, a composite structure is prepared which includes an insulating, supporting film 11 made of polyimide, a copper film 62 for the gate, and a copper film 72 for the cathode. FIG. 3 shows a finished product of the composite structure. Referring to FIG. 3, a composite structure 10 is made up of the insulating, supporting film 11 made of polyimide and the copper films 62 and 72 each bonded on the film 11 and having a predetermined pattern (i.e. inner electrode portions 62A and 72A corresponding, respectively, to the strip electrodes 6 and 7, and outer electrode portions 62B and 72B). In the example shown in FIG. 3, a large number of pairs of copper films 62 and 72 are formed on a tape-like or ribbon-like polyimide film 11 having a constant width, with each pair facing to each other in the width direction and with pairs being successively formed in the length direction of the film 11. The tape may be cut along the dotted lines shown in FIG. 3 to obtain individual composite structures. Alternatively, a plurality of semiconductor substrates can be successively bonded on the tape and then the tape can be cut to obtain individual semiconductor elements.

In order to make the composite structure, a copper film is bonded to one surface of a tape-shape polyimide film with an epoxy adhesive or the like throughout the surface. Then, the copper film is etched through the lift-off technique or screen printing technique so as to form a predetermined pattern.

Figure 4:
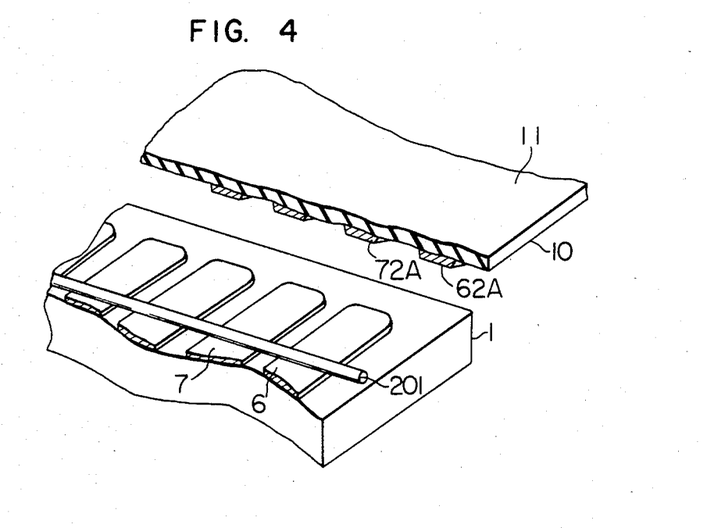
FIG. 4 is a perspective view showing a main step in a method for fabricating the semiconductor device.

FIG. 4 shows a main step for bonding a composite structure 10 to the gate electrode films 6 and cathode electrode films 7. According to this method, a fine solder wire 201 is used to bond the composite structure to the films 6 and 7. In this method, the solder wire 201 is placed on the cathode electrode and gate electrode films 7 and 6 in such a manner that the wire 201 intersects the films 7 and the films 6. Flux is added, if needed. Then, the composite structure 10 is placed on the surface of the semiconductor substrate through the solder wire 201 in such a manner that the copper films 72 and 62 face the electrode films 7 and 6, and is positioned so that the top surface of inner electrode portions 72A of the copper film 72 faces the top surface of the cathode electrode film 7 and the top surface of inner electrode portions 62A of the copper film 62 faces the top surface of the gate electrode film 6. Then, the solder wire 201 is heated and melted by means of a heating source. Since the solder 201 has a strong affinity for the metals, the metals are wet with solder. Therefore, the solder extends between each pair of cathode electrode film 7 and the copper film 72A for the cathode and between each pair of gate electrode film portion 6 and the copper film 62A for the gate, and escapes away from the other portions. Thereafter, the heating is stopped and the temperature is reduced to room temperature to complete the bonding. An infrared lamp, an electric furnace, or a hot air blast may be used as the heating source. The GTO element fabricated by the above-mentioned method is placed in a package and then the outer electrode portions 62B and 72B are connected to external electrode terminals to complete a single GTO device. Alternatively, the GTO element is placed on a substrate together with other electric parts and then electric connections are made between the GTO element and the electric parts to form a hybrid integrated circuit or a module device.

Figure 5:
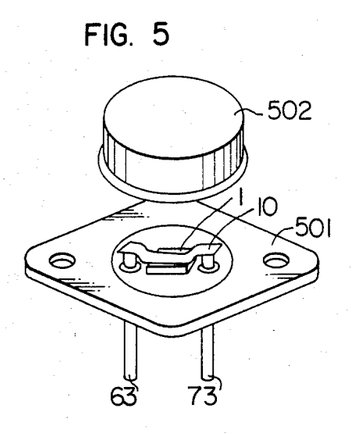
FIGS. 5 and 6 are perspective views showing states of how the semiconductor element as shown in FIGS. 1 and 2A to 2C is packaged.
Figure 6:
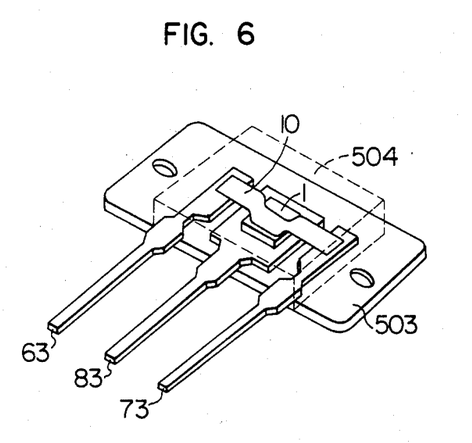

FIGS. 5, 6, 7a and 7b show examples of the packaging for the above-described GTO element. FIGS. 5 and 6 show the cases where discrete GTO devices are formed with the GTO element as described above, and FIGS. 7a and 7b show the case where the GTO element is mounted on a module substrate. The copper films for cathode and gate are not shown in FIGS. 5, 6, 7a and 7b for brevity's sake. Referring to FIG. 5, the GTO element including the semiconductor substrate 1 and the composite structure 10 bonded thereon is bonded to a metal stem 501 serving as an external anode electrode. An end portion of the copper film for the gate and an end portion of the copper film for the cathode are bonded respectively to the ends of an external gate electrode terminal 63 and an external cathode electrode terminal 73, both of which are insulated from the metal stem 501. A sealing metal cap 502 for encapsulating therein the GTO element, the end of the external gate electrode terminal 63 and the end of the external cathode electrode terminal 73, is put on and seals with the metal stem 501 to complete the GTO device.

FIG. 6 shows an example of plastic-package or resin mold type GTO devices. Referring to FIG. 6, the GTO element is bonded to one end of an external anode electrode terminal 83, which is bonded on a metal stem 503 serving as a heat sink. An end portion of the copper film for the gate and an end portion of the copper film for the cathode are bonded to one end of an external gate electrode terminal 63 and one end of an external cathode electrode terminal 73, respectively. The terminals 63 and 73 are insulated from the metal stem 503. After the above-mentioned bonding has been made, the GTO element and respective ends of the terminals 63 73 and 83, to which the GTO element is bonded, are sealed with a resin 504 to complete the GTO device.

Figure 7A:
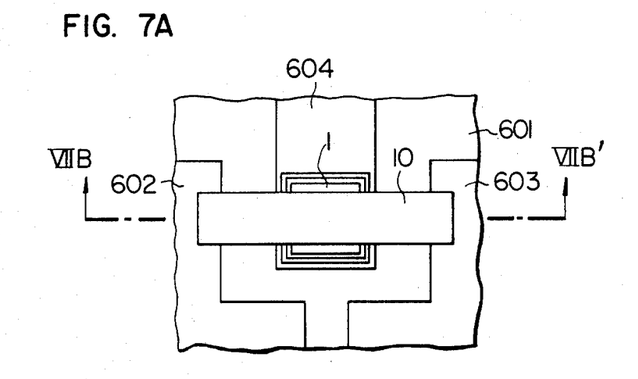
FIG. 7A is a plan view showing a main part of a module device, to which the embodiment of the GTO element is applied.
Figure 7B:
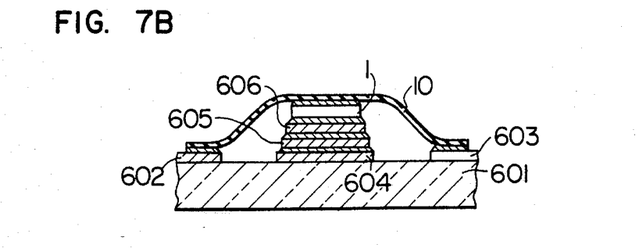
FIG. 7B is a sectional view taken along the line VIIB—VIIB' in FIG. 7A.

Now, an example of packaging for a module device will be explained with reference to FIGS. 7A and 7B. Referring to FIGS. 7A and 7B, metallized layers 602, 603 and 604 each formed with molybdenum, tungsten or the like are formed on one main surface of an alumina substrate 601. A copper plate 605 acting as a heat sink, a molybdenum plate 606 for mounting the GTO element and the GTO element 1 are piled in the order described on the metallized layer 604 and are bonded to each other with solder so as to form a layered structure. An end portion of the copper film for the gate and an end portion of the copper film for the cathode are bonded to the metallized layers 602 and 603, respectively, with solder. The metallized layers 602, 603 and 604 are extended on the alumina substrate 601 to other electric parts (not shown). That is, the layers 602, 603 and 604 are connected to the electric parts to form a predetermined circuit.

When the GTO element of the above embodiment is employed in a module device, the above-mentioned bonding operations can be advantageously simultaneously performed.

The above-mentioned embodiment of the present invention has the following advantages.

The first advantage of the GTO element resides in that the resistance in the lateral direction of the gate electrode and that of the cathode electrode become low even when the electrode films have a small thickness. The reason for this is that the inner electrode portions 62A and 72A of a copper film for the gate and the cathode have approximately the same form as the gate and cathode electrode films 6 and 7 and are bonded thereon. Therefore, the attenuation of the turn-off signal, and the nonuniform turn-off operation and the local concentration of current, due which are to the resistance of the electrode, can be mitigated.

In the case where the composite structure as described above is not employed, but instead the gate and cathode electrode films are simply made thick to reduce the resistance of these electrodes in the direction of the length thereof, various difficulties arise. For example, it takes a long period of time to deposit a sufficiently thick electrode film, and therefore productivity is lowered. Further, it is very difficult to process an evaporated film having a thickness of, for example, 40 to 50 $\mu$m so as to form a fine pattern. On the other hand, in the case where an electrode plate such as disclosed in the previously-referred to U.S. Pat. No. 3,601,667 is employed, it is very difficult to cut out a fine pattern from the plate, to arrange the fine pattern in registry with the gate electrode films and cathode electrode films, and to bond the fine pattern to these electrode films while maintaining registry therewith.

In U.S. Pat. No. 3,601,667, a thick metal plate to be bonded to the electrode film is shaped by machining. Machining a metal plate inevitably is accompanied by the occurrance of burrs which form an obstacle to the formation of good low resistance contact. There is no such concern of generating burrs according to the present invention.

Figure 8:
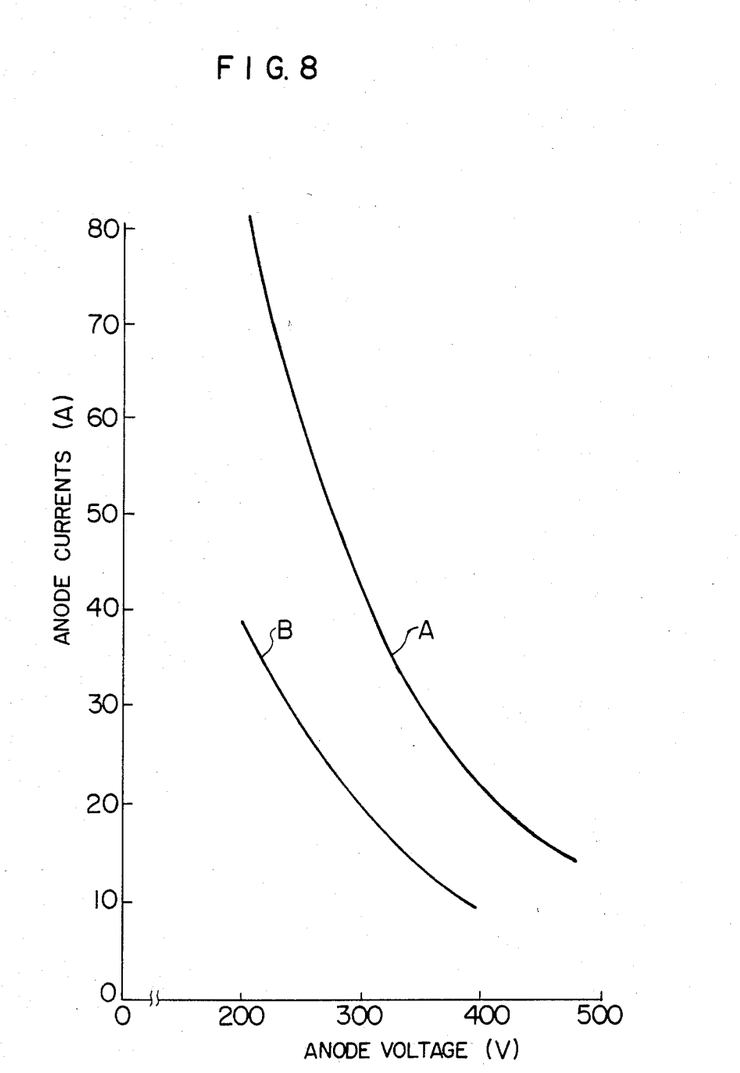
FIG. 8 is a graph for showing a difference in characteristic between a GTO element according to the present invention and a conventional GTO element.

FIG. 8 shows experimental results obtained by preventing the nonuniform turn-off operation and local concentration of current. That is, FIG. 8 shows relations between the anode voltage (between cathode and anode) and the anode current, both at the initial stage of the gate turn-off for the GTO element according to the present embodiment (A) and according to a conventional GTO element (B). The conventional GTO element (B) includes a semiconductor substrate which is the same in structure as the semiconductor substrate included in the GTO element (A), and a conventional electrode structure employing lead wires. The gate electrode films and the cathode electrode films have a three-layer structure of chromium, nickel and silver, and have a total thickness of about 10 $\mu$m.

When a gate turn-off signal is applied to a GTO thyristor which has been fully conducting, the voltage between the anode and the cathode (i.e. the anode voltage) rises from the forward voltage drop in "ON" state, which is very small, to the forward blocking voltage in "OFF" state. During such transient period, a considerable part of the anode (or positive hole) current is allowed to flow through the gate electrode. In other words, the anode current decays off as the anode voltage increases. FIG. 8 shows such turn-off action. As is apparent from FIG. 8, the GTO element (A) according to the present embodiment can control a current which is twice or more as large as a current controlled by the conventional GTO element (B). Further, the GTO element (A) has a larger area of safe operation than the conventional GTO element (B). In order to double the maximum interruptible current (anode current in FIG. 8) as mentioned above, it has been confirmed that each copper film of the composite structure has a thickness of at least 35 $\mu$m (that is has a resistance of 0.22 $\Omega$/mm for a width of 200 $\mu$m).

The second advantage of the GTO element according to the present embodiment resides in that the copper films for the gate and cathode can be used as a gate and a cathode lead, respectively. Therefore, a separate gate lead and a separate cathode lead, or any other corresponding parts become unnecessary. Thus, the number of parts is decreased and the bonding of the separate leads to the semiconductor substrate can be omitted. Further, since an electrode film and a lead are integrated in one body, the connecting portion between the electrode film and the lead is low in resistance and large in mechanical strength. Additionally, it is not required to reserve a bonding pad area on a main surface of the semiconductor substrate for bonding of lead wires, and therefore, the semiconductor substrate can be reduced by an area corresponding to the bonding pad area. Alternatively, the area required for bonding lead wires can be used as the n-type emitter region, and therefore a region where the main current flows can be increased without enlarging the semiconductor substrate.

Further, since the copper films of the composite structure have a sufficient flexibility, it is easy to handle the GTO element in assembling the GTO device.

The third advantage of the embodiment is that the copper films for the gate and cathode are bonded to and supported by an insulating, supporting film and therefore these copper films are large in mechanical strength. This makes it easy to handle the GTO element. Further, the insulating, supporting film 11 serves to protect a fine pattern portion of each copper film against external attacks.

The fourth advantage of the embodiment resides in that the copper film having a fine pattern can be readily made. This is because the above copper film is obtained by selectively etching a copper film attached on one surface of an insulating, supporting film, through an etching technique or the like.

The fifth advantage of the embodiment resides in that the copper film having a fine pattern can be brought into registry with an electrode film having a similar fine pattern with satisfactory accuracy. This is based upon the facts that the copper film having substantially the same fine pattern as that of the electrode is supported by the insulating, supporting film, and that the insulating, supporting film is made of polyimide having a high light-transmissivity, and therefore the copper film and the electrode film can be seen through the insulating, supporting film during the positioning. For enhancing this fifth advantage, the inner electrode portions preferably have a smaller width than that of the electrode on the semiconductor substrate, at least at two different locations, as is illustrated in FIG. 1 or 2B.

Figure 9:
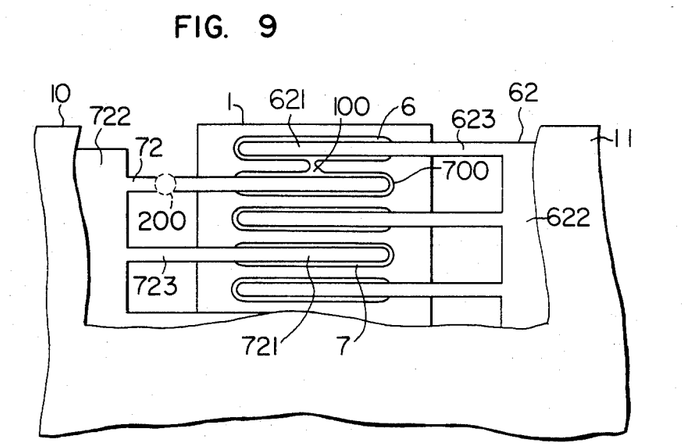
FIG. 9 is a partially cutaway plan view showing another embodiment of a GTO element according to the present invention.

FIG. 9 shows another embodiment of a GTO element according to the present invention. Like the electrode arrangement shown in FIGS. 1 and 2A to 2C, the electrode arrangement shown in FIG. 9 is suitable for use in a semiconductor device of multi-emitter type. FIG. 9 shows a part of a GTO element of multi-emitter type. FIG. 9 is a plan view similar to FIG. 1, and like parts are given the same reference numerals in FIGS. 1 and 9. A feature of the embodiment shown in FIG. 9 resides in that each of copper film 62 and 72 has inner electrode portions, trimming portions and an outer electrode portion. In more detail, the copper film 62 for gate electrode has inner electrode portions 621 each bonded to a gate electrode film 6 at substantially the whole surface thereof, trimming portions 623 each extended from one end of an inner electrode portion 621 to the outside of the edge of a semiconductor substrate 1, and an outer electrode portion 622 for connecting, in common, end portions of the trimming portions 623 which are remote from the inner electrode portions 621. Similarly, the copper film 72 for cathode electrode has inner electrode portions 721 each bonded to a cathode electrode film 7 at substantially the whole surface thereof, trimming portions 723 each extended from one end of an inner electrode portion 721 to the outside of the edge of the semiconductor substrate 1, and an outer electrode portion 722 for connecting, in common, end portions of the trimming portions 723 which are remote from the inner electrode portions 721. The essential feature of this embodiment is that the copper film has trimming portions.

The trimming portions 623 and 723 are provided for the following reasons. In a semiconductor device, a manufacturing error such as shorting between electrodes often takes place when electrode films are formed, since each of the electrode films has a fine pattern. Such a manufacturing error may be generated in the following manner.

Figure 10A:
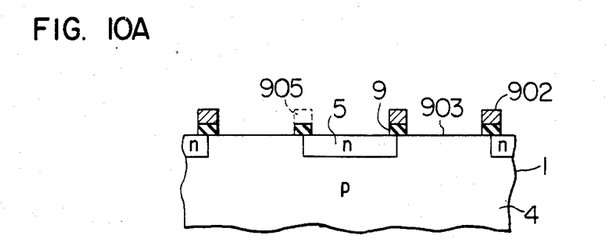
FIGS. 10A to 10C are sectional views for showing steps for fabricating electrode films of the embodiment shown in FIG. 9.
Figure 10B:
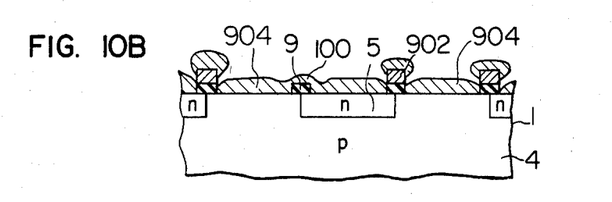
Figure 10C:
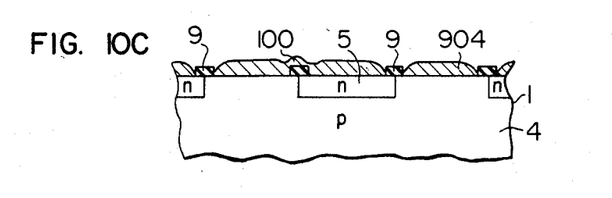

FIGS. 10A to 10C show a process for forming electrode films on a semiconductor substrate through the lift-off technique. FIG. 10A is a sectional view showing a state that an oxide film 9 and a photoresist pattern 902 are formed on a semiconductor substrate 1 having a p-type region 4 and an n-type region 5 through a conventional semiconductor device manufacturing technique, for example, the photolithographic technique, to obtain a contact hole 903 for an electrode. FIG. 10B is a sectional view showing a state that a metal film 904 to be used as electrode films is formed all over the surface of the substrate 1 through an evaporation technique or others. FIG. 10C is a sectional view showing a state that the photoresist pattern 902 is removed by heating the structure shown in FIG. 10B in an inert gas atmosphere to remove an unnecessary metal film on the photoresist pattern 902 and thus the metal film 904 remains only in the contact hole 903.

In the above-mentioned electrode forming process, especially in the photolithographic step, a defect 905 (shown in FIG. 10A) may be generated in the photoresist pattern 902, for example, a part 905 is missing from the photoresist pattern 902 due to a flaw in a photo mask or the like.

The defect 905 generates in the subsequent metal film forming step an unnecessary metal film 100 such as shown in FIG. 10B, and the p-type region 4 and the n-type region 5 are electrically shorted by the metal films 904 and 100.

In the foregoing description, the defect caused by the lift-off technique has been explained. In the case where the photo etching technique is employed, when an unnecessary photoresist portion is left, a metal film under the unnecessary photoresist portion is left unetched, and therefore an accidental short-circuit may be developed.

Further, in the case where a metallic mask is employed to selectively deposit a metal film on a semiconductor substrate, if the adhesion between the metallic mask and the substrate is not good, the metal vapor may get into a gap between the mask and the substrate, and thus a short-circuit may be developed.

Incidentally, a shorted portion is indicated by the reference numeral 100 in FIG. 9.

Further, even when a perfect electrode film is formed, at least one of a plurality of n-type emitter layers may be inoperative due to a defect within the semiconductor substrate. For example, when the above-mentioned GTO element is fabricated, if a large amount of unexpected p-type dopant adheres to a portion of the major surface 101 where one n-type emitter layer is to be formed, a cathode electrode film formed on the above portion and the p-type base layer 4 are shorted by a p-type layer formed at an area corresponding to the p-type dopant.

The damage to the GTO element due to the above-mentioned defect in the electrode film or within the semiconductor substrate can be made as small as possible by electrically isolating the defective n-type emitter region from other n-type emitter regions. When the defective emitter region is not electrically isolated, the GTO element cannot be used. According to the embodiment shown in FIG. 9, the above-mentioned electric isolation can be performed readily and surely by the trimming portion 723. Referring to FIG. 9, when a specified n-type emitter region 700 is inoperative due to the presence of the shorted portion 100, a trimming portion extending from the n-type emitter region 700 is cut by an appropriate punching tool or the like, at a place indicated by a dotted circle 200. The n-type emitter region 700 is electrically isolated from other n-type emitter regions 7 by the above-mentioned cutting operation, and the other n-type emitter regions 7 are prevented from being affected by the defective emitter region 700.

The present invention is not limited to the above-mentioned embodiments but includes various modifications and alterations of these embodiments. Now, examples of the modifications and changes will be explained below.

The insulating, supporting film may be removed in a final stage. When the composite structure and the semiconductor substrate are heated to bond the composite structure to the electrode films on the semiconductor substrate with solder, the copper films of the composite structure sometimes peel from the insulating, supporting film. However, such peeling causes no trouble in the finished GTO device. In a device controlling a relatively large power and generating a large amount of heat in operation, it is desirable to remove the insulating, supporting film in order to prevent a stress from being generated between the copper films and the insulating, supporting film due to a difference in thermal expansion coefficient between the copper film and the insulating, supporting film.

The materials of various members used in the above-mentioned embodiments may be varied. For example, the material of the gate electrode films 6 and cathode electrode films 7 may be a metal which can form a low resistance contact with the semiconductor substrate, such as aluminum. The copper films for gate and cathode may be replaced by other metal films having a high electric and heat conductivity. The insulating, support film may be made of polyester, polyamide, or the like. The copper film may be bonded to the insulating, supporting film with an appropriate adhesive agent other than the epoxy adhesive agent. Alternatively, the copper films may be adhered to the insulating, supporting film by pressing the copper films against the insulating, supporting film while heating these films, without employing any adhesive agent. Needless to say, the thickness, width or length of each of the copper film and the insulating, supporting film can be selected freely.

The methods for fabricating the embodiments may be changed in various manners. For example, although the composite structure is bonded to the electrode films with the solder wire in the above-mentioned method, the composite structure may be bonded to the electrode films with a solder layer which has been previously formed on the composite structure or on each of the electrode films. The solder layer can be formed by a plating method such as immersion plating, electroplating or chemical plating, an evaporation and others. The use of previously-formed solder layer is advantageous in mass production.

The present invention is not limited to the GTO device, but is applicable to thyristors of other kinds, transistors, planar-type diodes, and others.

In the above-described GTO, another n-type region, i.e. anode shorting region, may be provided in the p-type emitter layer 2 so as to contact with both the n-type base layer 3 and the anode electrode 8 for enhancing the gate turn-off characteristics.

Figure 11A:
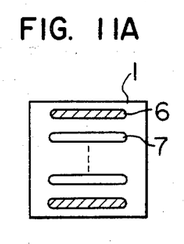
FIGS. 11A to 11D are plan views for showing electrode films of various patterns, to which the present invention is applicable.
Figure 11B:
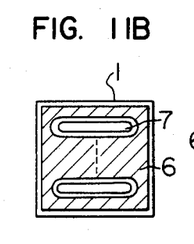
Figure 11C:
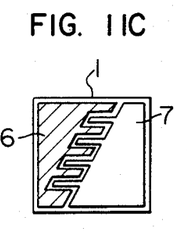
Figure 11D:
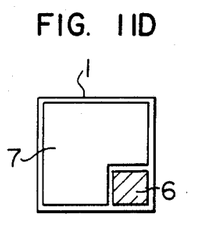

Further, the present invention is applicable to not only the semiconductor device of multi-emitter type but also semiconductor devices having various electrode film patterns. FIGS. 11A to 11D various other electrode film patterns to which the present invention is applicable. In FIGS. 11A to 11D, one main electrode is indicated by reference numeral 7 and a control electrode is indicated by reference numeral 6. Further, in order to facilitate the understanding of these figures, the control electrode 6 is indicated by a hatched area. FIG. 11A shows the pattern used in the above-mentioned embodiments. A pattern shown in FIG. 11B includes a plurality of main electrodes 7 and a control electrode 6 surrounding the main electrodes 7, and can decrease the resistance of the control electrode. In a pattern shown in FIG. 11C, the main electrode 7 and the control electrode 6 are arranged in an interdigitated manner. Such an arrangement is widely used in transistors and other devices. In a pattern shown in FIG. 11D, the control electrode 6 is arranged at a corner portion of one surface of the semiconductor substrate. Such an arrangement of the control electrode is widely used in reverse blocking thyristors and other devices.

What is claimed is:

1. A semiconductor device comprising:
a semiconductor substrate having a pair of opposite major surfaces and including between said major surfaces a plurality of first semiconductor regions of one conductivity type exposed to one major surface of the substrate, and a second semiconductor region of another conductivity type opposite to said one conductivity type adjacent to said first semiconductor regions and exposed to said one major surface so that said first semiconductor regions are individually separated and surrounded by said second semiconductor region in said one major surface,
a plurality of first conductive members each disposed to have a lower surface thereof directly on and in ohmic contact with said first semiconductor regions, each of said first conductive members having an upper surface having an area of a predetermined shape, and
a second conductive member having a plurality of inner conductive portions which each have a lower surface disposed directly on and bonded conductively to corresponding upper surface portions of said first conductive members, wherein each said lower surface of each of said inner conductive portions has a region having a shape substantially corresponding to the shape of said upper surface of first conductive members to which it is bonded, said second conductive member further comprising a flexible outer conductive portion which is integrated with said inner conductive portions and which is not disposed directly on said first conductive members,
wherein said upper and lower surfaces of said plurality of first conductive members have substantially the same predetermined shape, and further wherein each of said first semiconductor regions is constructed to have an area in said first major surface which has a predetermined shape which substantially corresponds to said predetermined shape of said upper and lower surfaces of said first conductive member,
wherein said area of each of said first semiconductor regions in said first major surface is slightly greater than an area of either said upper or lower surfaces of said plurality of first conductive members, and
wherein an area of lower surfaces of each of said regions of said inner conductive portions is slightly less than an area of either said upper or lower surfaces of said plurality of first conductive members.

* * * * *